(12) United States Patent
Lee et al.

(10) Patent No.: US 11,520,206 B2
(45) Date of Patent: Dec. 6, 2022

(54) ACTIVE METAMATERIAL ARRAY AND METHOD FOR MANUFACTURING THE SAME

(71) Applicant: Foundation of Soongsil University-Industry Cooperation, Seoul (KR)

(72) Inventors: Ho Jin Lee, Seoul (KR); Moon Sung Kang, Seoul (KR); Hyun Seung Jung, Seoul (KR); Eun Ah Heo, Incheon (KR); Bo Eun Cho, Incheon (KR); Jae Mok Koo, Seoul (KR)

(73) Assignee: FOUNDATION OF SOONGSIL UNIVERSITY-INDUSTRY COOPERATION, Seoul (KR)

( * ) Notice: Subject to any disclaimer, the term of this patent is extended or adjusted under 35 U.S.C. 154(b) by 1108 days.

(21) Appl. No.: 16/087,701

(22) PCT Filed: Feb. 22, 2017

(86) PCT No.: PCT/KR2017/001929
§ 371 (c)(1),
(2) Date: Sep. 24, 2018

(87) PCT Pub. No.: WO2017/164523
PCT Pub. Date: Sep. 29, 2017

(65) Prior Publication Data
US 2020/0301224 A1      Sep. 24, 2020

(30) Foreign Application Priority Data

Mar. 25, 2016  (KR) .................. 10-2016-0036044
Oct. 12, 2016  (KR) .................. 10-2016-0132263

(51) Int. Cl.
*H01L 35/08*       (2006.01)
*G02F 1/155*       (2006.01)
(Continued)

(52) U.S. Cl.
CPC ............. *G02F 1/155* (2013.01); *G02B 1/002* (2013.01); *H01G 9/048* (2013.01); *H01G 9/16* (2013.01);
(Continued)

(58) Field of Classification Search
CPC ...................................................... H04L 12/50
(Continued)

(56) References Cited

U.S. PATENT DOCUMENTS

2008/0136563 A1    6/2008  Duwel et al.
2009/0262766 A1   10/2009  Chen et al.
(Continued)

FOREIGN PATENT DOCUMENTS

KR    10-2016-0013423 A    2/2016

OTHER PUBLICATIONS

International Search Report for International Application No. PCT/KR2017/001929 dated May 23, 2017.

*Primary Examiner* — Dang T Ton
(74) *Attorney, Agent, or Firm* — Pearne & Gordon LLP (57) ABSTRACT

An active metamaterial array of the present disclosure includes: a substrate; a plurality of metamaterial structures disposed on the substrate and spaced apart from each other; a conductivity variable material layer formed between each of the plurality of the metamaterial structures so as to selectively connect the metamaterial structures; an electrolyte material layer formed on the metamaterial structures and the conductivity variable material layer; and a gate electrode disposed at one end of the substrate so as to be in contact with one region of the electrolyte material layer, and when an external voltage is applied to the gate electrode, the gate electrode changes the conductivity of the conductivity variable material layer by controlling the migration of ions contained in the electrolyte material layer.

12 Claims, 10 Drawing Sheets

(51) Int. Cl.
  *H01G 9/048* (2006.01)
  *H01G 9/16* (2006.01)
  *G02B 1/00* (2006.01)
  *H01L 27/24* (2006.01)
  *H01L 45/00* (2006.01)

(52) U.S. Cl.
  CPC .......... *H01L 27/2463* (2013.01); *H01L 45/08* (2013.01)

(58) Field of Classification Search
  USPC ....................................................... 370/329
  See application file for complete search history.

(56) References Cited

U.S. PATENT DOCUMENTS

| | | |
|---|---|---|
| 2013/0342279 A1 | 12/2013 | Sensale-Rodriguez et al. |
| 2014/0048710 A1 | 2/2014 | Xu et al. |
| 2014/0085711 A1 | 3/2014 | Sonkusale et al. |
| 2019/0058242 A1* | 2/2019 | Tabe ..................... H01Q 1/248 |

* cited by examiner

ACTIVE METAMATERIAL ARRAY AND METHOD FOR MANUFACTURING THE SAME

CROSS-REFERENCE TO RELATED APPLICATION

This application claims the benefit under 35 USC 119(a) of Korean Patent Application No. 10-2016-0132263 filed on Oct. 12, 2016, and Korean Patent Application No. 10-2016-0036044 filed on Mar. 25, 2016, in the Korean Intellectual Property Office.

TECHNICAL FIELD

The present disclosure relates to an active metamaterial array and a method for manufacturing the same.

BACKGROUND

Active metamaterial technology refers to the technology of selectively controlling visible light (VL), infrared rays (IR), ultraviolet rays (UV), and terahertz waves using the structure, conductivity and array form of meta-atoms forming a metamaterial and has been established as an important field of research to implement, particularly, a terahertz system. A metamaterial array for actively varying the control of terahertz waves has been implemented using electrically, optically, mechanically, and thermally varying methods. A method for switching terahertz waves by varying the conductivity of the entire array of a metamaterial or a partial area of meta-atoms with an external stimulus is being researched. Also, a method for controlling spectral characteristics by making a mechanical change using a micro electro mechanical system (MEMS) to vary the spatial arrangement of a metamaterial is being researched. However, active metamaterials reported so far have limitations in a variable range of frequency and phase or variation in resonance due to limited design methods. Accordingly, it has been difficult to commercialize an active terahertz system.

Figure 1A:
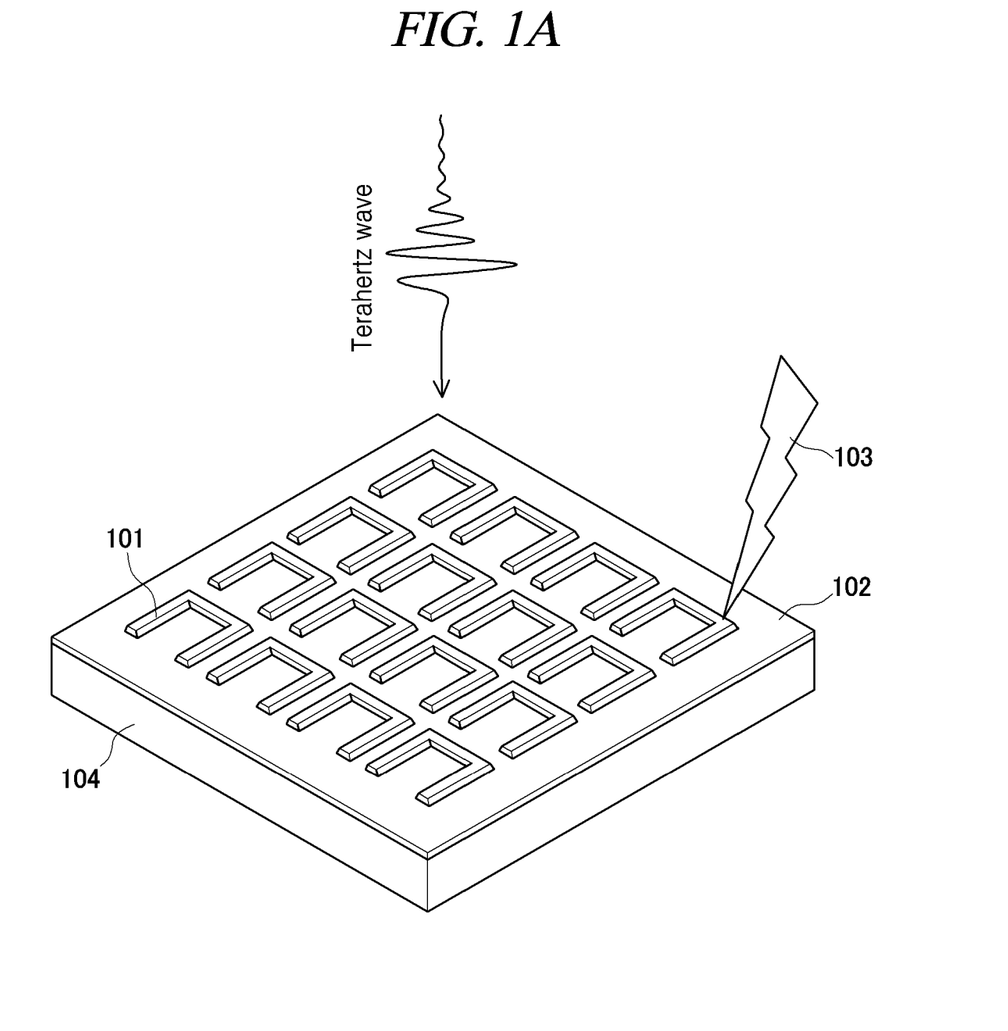
Figure 1B:
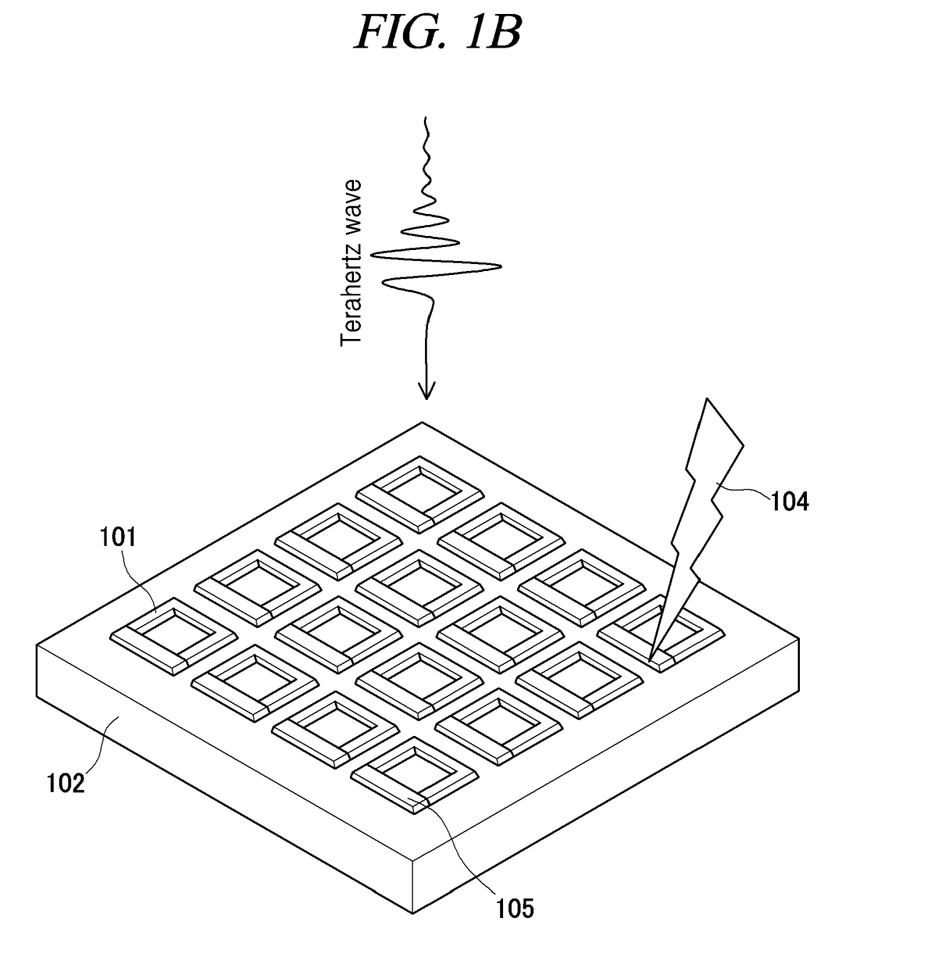

FIG. 1A and FIG. 1B are diagrams schematically illustrating a conventional metamaterial array. In this regard, referring to FIG. 1A, the technology of controlling a change in all of metamaterial structures 101 is implemented by coating a conductivity variable material on the entire substrate 102 including the metamaterial structures 101, varying the conductivity with an external stimulus 103 as illustrated in FIG. 1A, and thus switching a resonance of a metamaterial. This method can switch the resonance of the metamaterial without a need for an additional pattern, but cannot vary a resonant frequency to have a desired frequency or phase.

Further, referring to FIG. 1B, the technology of controlling a change in all of the metamaterial structures 101 each further including a semiconductor layer 105 can vary a resonant frequency with an external stimulus, but has a variable range limited within a structure of the metamaterial structures. Furthermore, it is difficult to arrange electrical wires for a change in each metamaterial structure. Accordingly, there is a limit to a varying method.

In this regard, Korean Laid-open Publication No. 2016-0013423 (entitled "A frequency-modulating high-efficient terahertz transceiver") as a prior art discloses a frequency-modulating high-efficient terahertz transceiver that can increase the generation and output of terahertz waves and the measurement sensitivity and can also modulate a frequency.

DISCLOSURE OF THE INVENTION

Problems to be Solved by the Invention

The present disclosure is conceived to solve the above-described problems and provides a metamaterial array in which all of multiple metamaterial structures are connected or disconnected by varying the conductivity of a conductivity variable material layer configured to connect metamaterial structures.

However, problems to be solved by the present disclosure are not limited to the above-described problems. There may be other problems to be solved by the present disclosure.

Means for Solving the Problems

As a technical means for solving the above-described technical problems, an active metamaterial array according to an embodiment of the present disclosure includes: a substrate; multiple metamaterial structures disposed on the substrate and spaced apart from each other; a conductivity variable material layer formed between each of the multiple metamaterial structures so as to selectively connect the metamaterial structures; an electrolyte material layer required to control the conductivity of the conductivity variable material layer; and a gate electrode disposed at one end of the substrate so as to be in contact with an electrolyte, and when an external voltage is applied to the gate electrode, the gate electrode changes the conductivity of the conductivity variable material layer by controlling the migration of ions contained in the electrolyte material layer.

Further, a method for manufacturing an active metamaterial array according to an embodiment of the present disclosure includes: forming multiple metamaterial structures on a substrate to be spaced apart from each other; forming a semiconductor or a conductivity variable material layer between each of the multiple metamaterial structures so as to selectively connect the metamaterial structures; forming an electrolyte material layer on the metamaterial structures and the conductivity variable material layer; and forming a gate electrode to be disposed at one end of the substrate so as to be in contact with one region of the electrolyte material layer.

Effects of the Invention

According to the above-described technical means for solving technical problems of the present disclosure, it is possible to provide a metamaterial array having a wide variable range and selectivity in frequency and phase with high resolution as compared to a conventional metamaterial array, and also it is possible to reduce processes and costs.

Further, it is possible to overcome a conventional metamaterial design technology in which the overall control range of terahertz waves is limited and it is basically difficult to precisely modulate a phase and a frequency, and it is possible to secure a higher range of phase shift as well as a wider variable range of terahertz frequency and thus possible to freely control a propagation direction of terahertz waves. Furthermore, it can also be applied to the visible, infrared, and ultraviolet bands in addition to the terahertz band.

BRIEF DESCRIPTION OF THE DRAWINGS

FIG. 1A and FIG. 1B are diagrams schematically illustrating a conventional metamaterial array, and FIG. 1A is provided to explain the technology of controlling a change in all of metamaterial structures and FIG. 1B is provided to explain the technology of controlling a change in all of metamaterial structures each further including a semiconductor layer.

FIG. 5A and FIG. 5B are conceptual diagrams illustrating that metamaterial structures are connected as a single metamaterial molecular structure according to an embodiment of the present disclosure, and FIG. 5A is a diagram provided to explain metamaterial structures arranged horizontally or vertically in a line and FIG. 5B is a diagram provided to explain metamaterial structures arranged in a matrix form.

BEST MODE FOR CARRYING OUT THE INVENTION

Hereinafter, embodiments of the present disclosure will be described in detail with reference to the accompanying drawings so that the present disclosure may be readily implemented by a person with ordinary skill in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, it is to be understood that the term "comprises or includes" and/or "comprising or including" used in the document means that one or more other components, steps, operation and/or existence or addition of elements are not excluded in addition to the described components, steps, operation and/or elements unless context dictates otherwise and is not intended to preclude the possibility that one or more other features, numbers, steps, operations, components, parts, or combinations thereof may exist or may be added.

Figure 2:
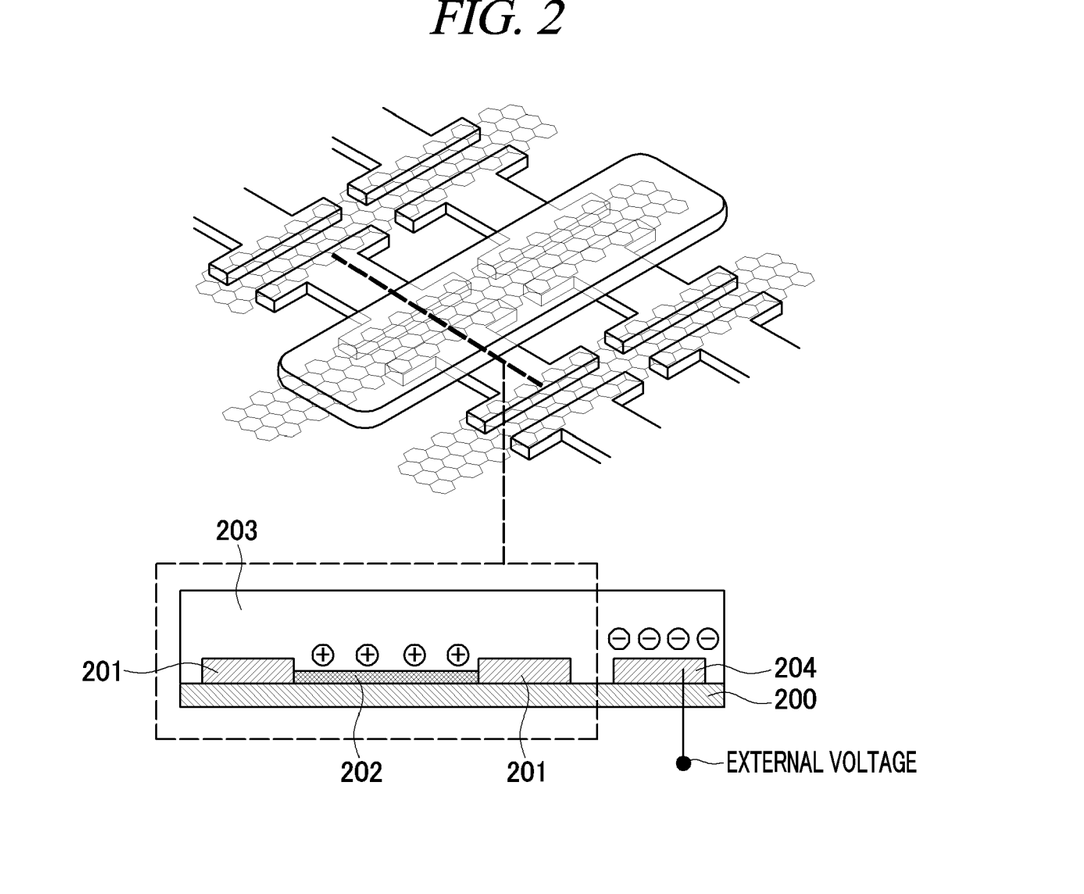
FIG. 2 is a cross-sectional view provided to explain a structure of a meta-atom array according to an embodiment of the present disclosure.

FIG. 2 is a cross-sectional view provided to explain a structure of a meta-atom array according to an embodiment of the present disclosure.

Referring to FIG. 2, an active metamaterial array according to the present disclosure includes a substrate 200, metamaterial structures 201, a conductivity variable material layer, an electrolyte material layer 203, and a gate electrode 204. Herein, the metamaterial structures 201 are spaced apart from each other, and the conductivity variable material layer 202 is formed between the metamaterial structures 201 so as to selectively connect the metamaterial structures 201. The electrolyte material layer 203 is formed on the metamaterial structures 201 and the conductivity variable material layer 202, and the gate electrode 204 is disposed at one end of the substrate 200 so as to be in contact with one region of the electrolyte material layer 203. Herein, when an external voltage is applied to the gate electrode 204, the gate electrode 204 can change the conductivity of the conductivity variable material layer 202 by controlling the migration of ions contained in the electrolyte material layer 203. As the conductivity of the conductivity variable material layer 202 is changed, all of the multiple metamaterial structures 201 are connected or disconnected, and, thus, a resonant frequency and a phase can be changed. The active metamaterial array according to the present disclosure has a wide variable range and selectivity in frequency and phase with high resolution as compared to a conventional metamaterial array and can be manufactured at reduced costs.

Figure 3A:
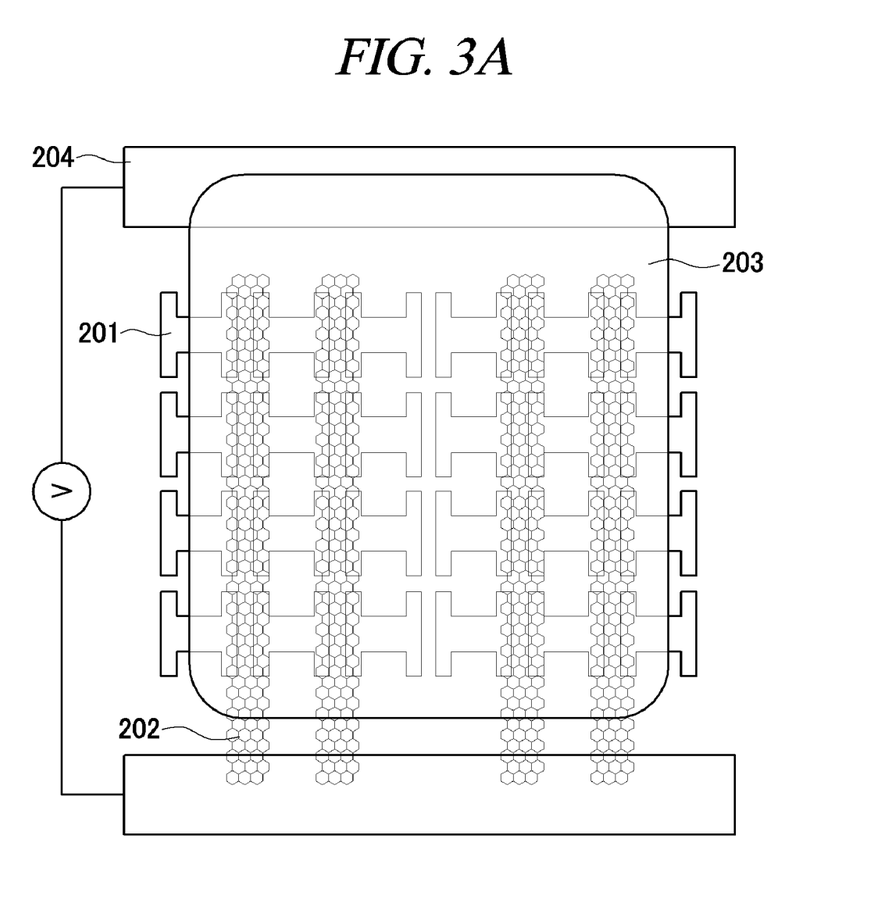
FIG. 3A is a diagram provided to explain a method for controlling metamaterial structures using an electrolyte material layer formed corresponding in size to all of metamaterial structures according to an embodiment of the present disclosure.
Figure 3B:
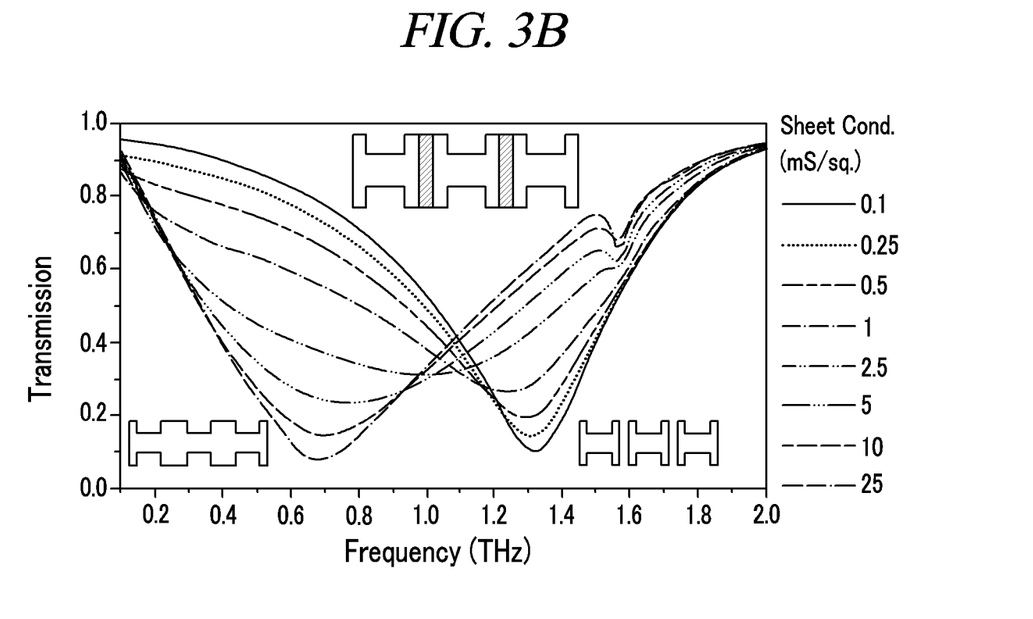
FIG. 3B is a diagram showing the result of varying a frequency depending on a change in conductivity of a conductivity variable material layer containing a semiconductor and graphene according to an embodiment of the present disclosure.
Figure 3C:
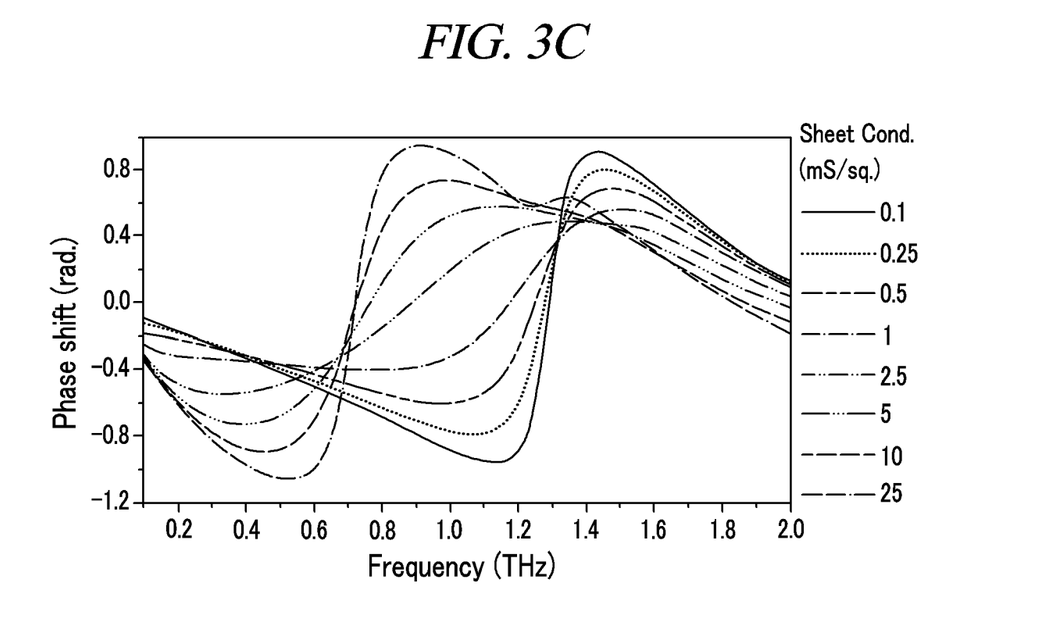
FIG. 3C is a diagram showing the result of varying a phase depending on a change in conductivity of a conductivity variable material layer containing a semiconductor and graphene according to an embodiment of the present disclosure.
Figure 4A:
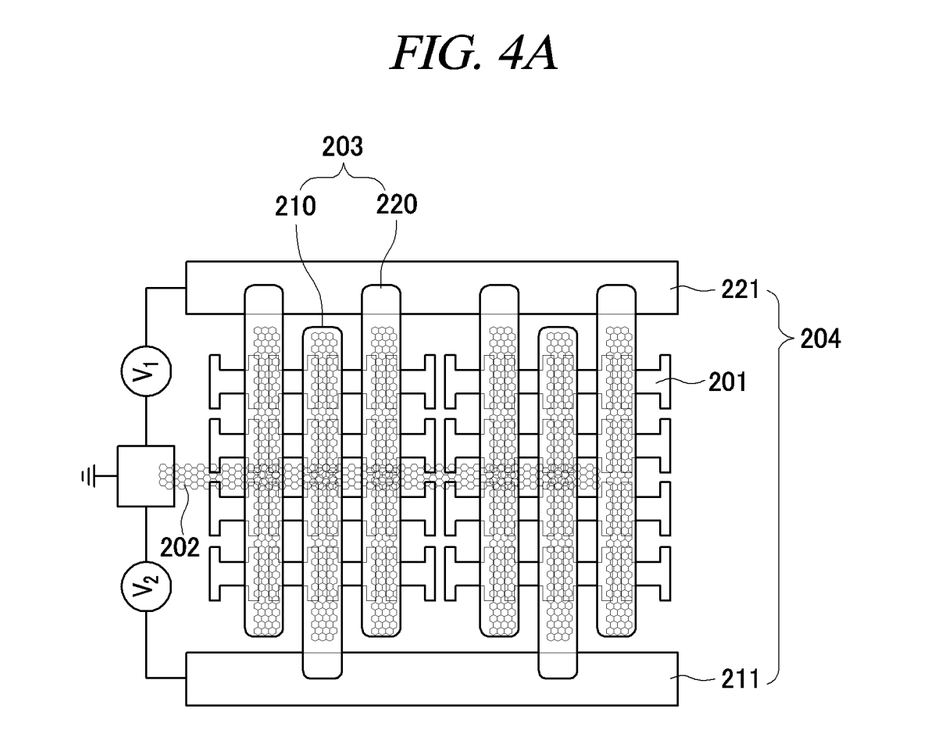
FIG. 4A is a diagram provided to explain a method for controlling metamaterial structures using multiple electrolyte material layers arranged in a matrix form according to an embodiment of the present disclosure.
Figure 4B:
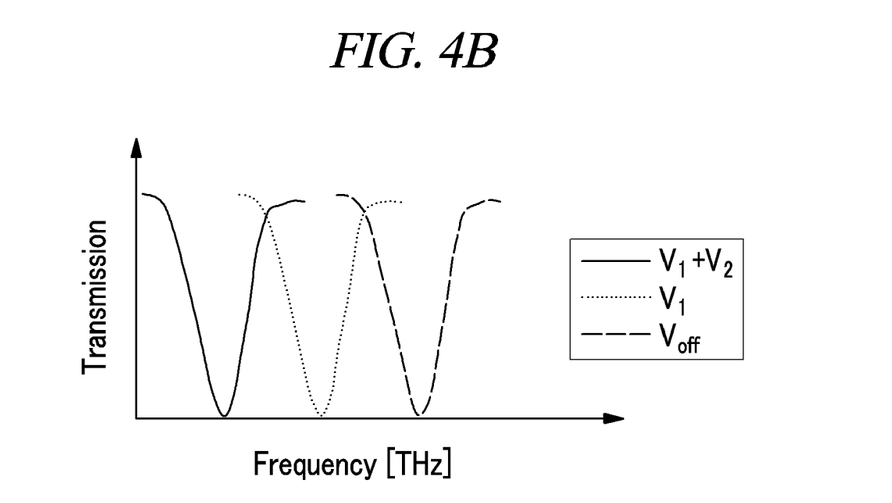
FIG. 4B is a diagram illustrating multiple frequencies caused by modulation of an external voltage connected to the multiple electrolyte material layers illustrated in FIG. 4A.
Figure 4C:
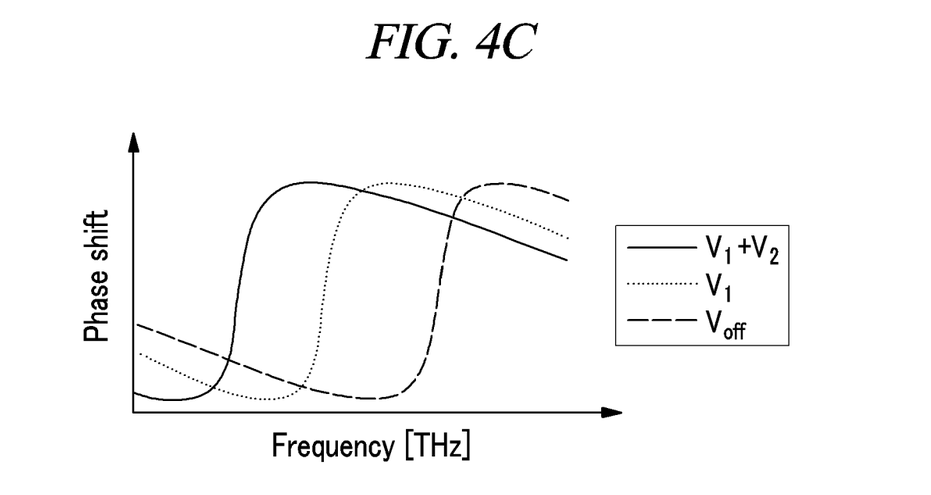
FIG. 4C is a diagram illustrating a graded change in phase shift caused by modulation of an external voltage connected to the multiple electrolyte material layers illustrated in FIG. 4A.
Figure 5A:
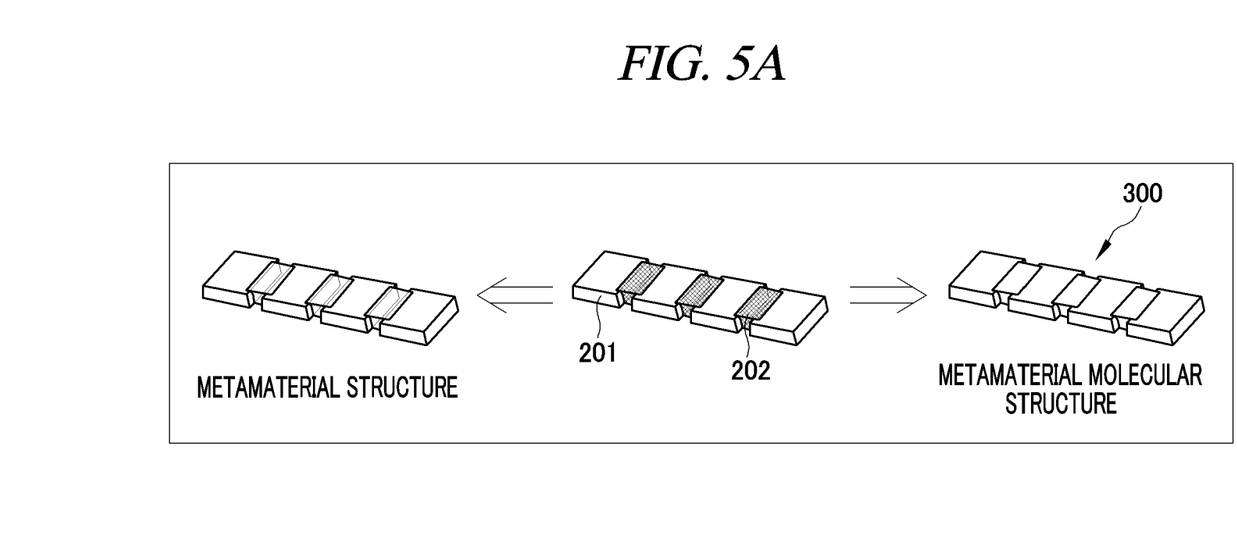
Figure 5B:
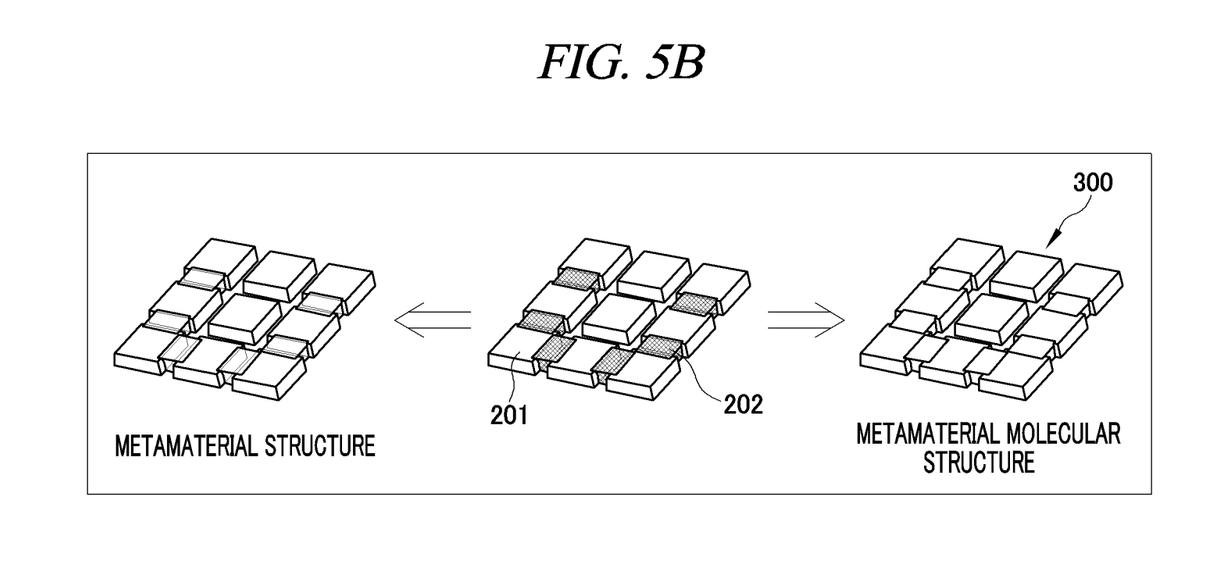

FIG. 3A is a diagram provided to explain a method for controlling metamaterial structures using an electrolyte material layer formed corresponding in size to all of metamaterial structures according to an embodiment of the present disclosure, FIG. 3B is a diagram showing the result of varying a frequency depending on a change in conductivity of a conductivity variable material layer containing a semiconductor and graphene according to an embodiment of the present disclosure, FIG. 3C is a diagram showing the result of varying a phase depending on a change in conductivity of a conductivity variable material layer containing a semiconductor and graphene according to an embodiment of the present disclosure, FIG. 4A is a diagram provided to explain a method for controlling metamaterial structures using multiple electrolyte material layers arranged in a matrix form according to an embodiment of the present disclosure, FIG. 4B is a diagram illustrating multiple frequencies caused by modulation of an external voltage connected to the multiple electrolyte material layers illustrated in FIG. 4A, FIG. 4C is a diagram illustrating a graded change in phase shift caused by modulation of an external voltage connected to the multiple electrolyte material layers illustrated in FIG. 4A, FIG. 5A and FIG. 5B are is conceptual diagrams illustrating that metamaterial structures are connected as a single metamaterial molecular structure according to an embodiment of the present disclosure, and FIG. 5A is a diagram provided to explain metamaterial structures arranged horizontally or vertically in a line and FIG. 5B is a diagram provided to explain metamaterial structures arranged in a matrix form.

Referring to FIG. 2 and FIG. 3A, the metamaterial structures 201 are formed as multiple units and spaced apart from each other on the substrate 200. These multiple metamaterial structures 201 may be arranged in a matrix form.

Each metamaterial structure 201 is configured as any shape showing the resonance property for the input wave, particularly including a rectangular intermediate portion and both end portions formed on both sides of the intermediate portion. The intermediate portion has a greater horizontal length than each of the both end portions and a smaller vertical length than the both end portions. For example, the metamaterial structure 201 may be formed into an H-shape or an I-shape. The metamaterial structures 201 and the gate electrode 204 to be described later may be formed using the same mask.

The conductivity variable material layer 202 may be formed between the multiple metamaterial structures 201 to selectively connect the metamaterial structures 201. In an additional embodiment, the conductivity variable material layer 202 may be formed on or under the metamaterial structures 201 to connect the metamaterial structures 201.

The conductivity variable material layer 202 may have a sufficient length to connect the multiple metamaterial structures 201 and may be formed as multiple layers in one direction. Herein, the multiple conductivity variable material layers 202 may be spaced apart from each other.

The conductivity variable material layer 202 may be formed of graphene, silicon, oxide semiconductor, or dielectric-metal transition material, but may not be limited thereto and may be formed of conductivity variable materials including other semiconductor materials.

Specifically, the conductivity variable material layer 202 may conductively connect the metamaterial structures 201, and all of the multiple metamaterial structures 201 can be connected or disconnected by varying the conductivity of the conductivity variable material layer 202. Thus, a resonant frequency of the active metamaterial array can be changed. In this case, the conductivity of the conductivity variable material layer 202 can be varied by the migration of ions in the electrolyte material layer 203 to be described later.

Referring to FIG. 5A and FIG. 5B, if the conductivity of the conductivity variable material layer 202 is greater than a predetermined reference level, the multiple metamaterial structures 201 can be controlled as a single metamaterial molecular structure 300.

In the metamaterial molecular structure 300, the multiple metamaterial structures 201 may be arranged horizontally, vertically, or in a matrix form and connected to each other.

For example, as illustrated in FIG. 5A, if the conductivity of the conductivity variable material layer 202 formed between the metamaterial structures 201 arranged horizontally or vertically in a line is greater than a predetermined reference level, the multiple metamaterial structures 201 can be controlled as the single metamaterial molecular structure 300. Further, as illustrated in FIG. 5B, even if the conductivity of the conductivity variable material layer 202 formed between the metamaterial structures 201 arranged in a matrix form is greater than a predetermined reference level, the multiple metamaterial structures 201 can be controlled as the single metamaterial molecular structure 300. Therefore, according to the present disclosure, it is possible to actively control a phase of the metamaterial structures 201 as the metamaterial molecular structure 300 and thus possible to implement an active metamaterial plane lens capable of actively controlling a propagation direction of terahertz waves or controlling a focusing point.

Referring to FIG. 2 again, the electrolyte material layer 203 is formed on the metamaterial structures 201 and the conductivity variable material layer 202.

The electrolyte material layer 203 used herein may be manufactured without a pattern through a spin coating process or a drop coating process, or may include a pattern through photolithography or selective photocuring.

Referring to FIG. 3A and FIG. 4A, the electrolyte material layer 203 may be formed as one layer corresponding in size to all of the metamaterial structures 201 or may be formed as multiple layers corresponding in length to each column or each row of the metamaterial structures 201 arranged in a matrix form.

For example, as illustrated in FIG. 4A, the electrolyte material layer 203 may include multiple first electrolyte material layers 210 and second electrolyte material layers 220, and the multiple first electrolyte material layers 210 and second electrolyte material layers 220 are formed into multiple of user defined shapes and may be arranged alternately. Herein, the multiple first electrolyte material layers 210 may be connected to a first gate electrode 211 to be described later, and the multiple second electrolyte material layers 220 may be connected to a second gate electrode 221 to be described later.

The gate electrode 204 may be disposed at one end of the substrate 200 so as to be in contact with one region of the electrolyte material layer 203. When an external voltage is applied to the gate electrode 204, the gate electrode 204 may change the conductivity of the conductivity variable material layer 202 by controlling the migration of ions contained in the electrolyte material layer 203.

For example, referring to FIG. 3A, when a voltage is applied, the conductivity of the conductivity variable material layer 202 can be varied by the migration of ions in the electrolyte material layer 203, and, thus, the metamaterial structures 201 connected by the conductivity variable material layer 202 can form resonance as the single metamaterial molecular structure 300.

FIG. 3B and FIG. 3C show a resonant frequency and a phase shift of the metamaterial structures 201 depending on a change in conductivity of the conductivity variable material layer 202 according to an embodiment of the present disclosure. It can be seen that when the conductivity of the conductivity variable material layer 202 increases, the multiple metamaterial structures 201 are molecularized to form the metamaterial molecular structure 300 and move at a low resonant frequency. Meanwhile, it can be seen that when the conductivity of the conductivity variable material layer 202 decreases, the metamaterial molecular structure 300 cannot be formed but the multiple metamaterial structures 201 remain and move at a high resonant frequency with a phase shift.

That is, by controlling the conductivity of the conductivity variable material layer 202, the metamaterial structures 201 can be molecularized and a wide variable range of frequency and phase can be obtained. Further, the number of the metamaterial structures 201 connected as the metamaterial molecular structure 300 can be set in a designing process. By changing the number of the conductivity variable material layers 202 connected between the metamaterial structures 201, a frequency or phase shift range can be controlled as desired by the designer.

Referring to FIG. 4A, the gate electrode 204 is formed as multiple units, and the gate electrodes 204 are formed on one end and the other end, respectively, of the substrate 200, and different voltages may be applied to the respective gate electrodes 204.

For example, referring to FIG. 4A to FIG. 4C, the gate electrodes 204 include a first gate electrode 211 and a second gate electrode 221 provided on one end and the other end, respectively, of the substrate 200. The first gate electrode 211 may be connected to the multiple first electrolyte material layers 210 and the second gate electrode 221 may be connected to the multiple second electrolyte material layers 220. Herein, the first electrolyte material layers 210 and the second electrolyte material layers 220 can operate independently by the first gate electrode 211 and the second gate electrode 221.

Since different voltages V1 and V2 are independently applied to the first gate electrode 211 and the second gate electrode 221, various frequencies and phase shifts can be obtained. As shown in FIG. 4B and FIG. 4C, when, for example, the voltages V1 and V2 are applied to all of the gate electrodes 211 and 221 or voltage V1 or V2 is applied to any one gate 211 or 221, it is possible to select multiple frequencies and phases.

Hereinafter, a method for manufacturing an active metamaterial array will be described.

Figure 6:
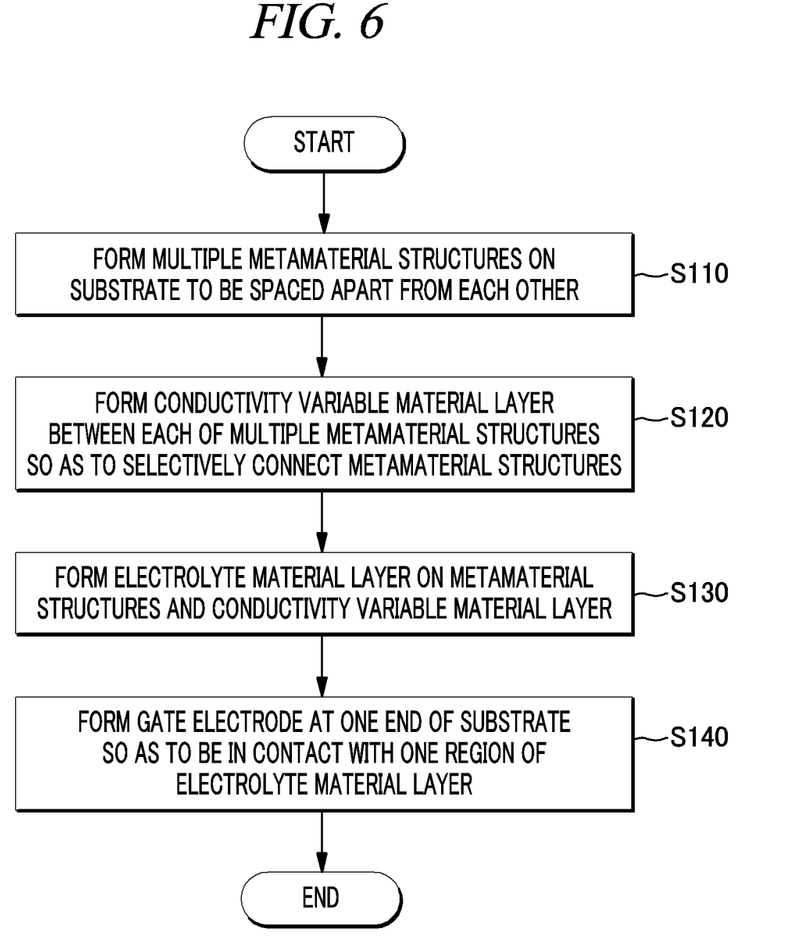
FIG. 6 is a flowchart provided to explain a method for manufacturing an active metamaterial array according to an embodiment of the present disclosure.

FIG. 6 is a flowchart provided to explain a method for manufacturing an active metamaterial array according to an embodiment of the present disclosure.

Descriptions of the components that perform the same functions as the above-described components illustrated in FIG. 1A to FIG. 5B will be omitted.

Referring to FIG. 2 and FIG. 6, the multiple metamaterial structures 201 are formed on the substrate 200 to be spaced apart from each other (S110).

Then, the conductivity variable material layer 202 is formed between each of the multiple metamaterial structures 201 so as to selectively connect the metamaterial structures 201 (S120).

Then, the electrolyte material layer 203 is formed on the metamaterial structures 201 and the conductivity variable material layer 202 (S130).

Finally, the gate electrode 204 is formed to be disposed at one end of the substrate 200 so as to be in contact with one region of the electrolyte material layer 203 (S140). When an external voltage is applied to the gate electrode 204, the electrolyte material layer 203 controls the migration of ions contained in the electrolyte material layer 203, and, thus, the conductivity of the conductivity variable material layer 202 can be changed.

The above description of the present disclosure is provided for the purpose of illustration, and it would be understood by a person with ordinary skill in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. An active metamaterial array, comprising:
a substrate;
a plurality of metamaterial structures disposed on the substrate and spaced apart from each other;
a conductivity variable material layer formed between each of the plurality of the metamaterial structures so as to selectively connect the metamaterial structures;
an electrolyte material layer formed on the metamaterial structures and the conductivity variable material layer; and
a gate electrode disposed at one end of the substrate so as to be in contact with one region of the electrolyte material layer,
wherein when an external voltage is applied to the gate electrode, the gate electrode changes the conductivity of the conductivity variable material layer by controlling the migration of ions contained in the electrolyte material layer,
wherein as the conductivity of the conductivity variable material layer is changed, all of the plurality of metamaterial structures are connected or disconnected, and, thus, a resonant frequency and a phase are changed.

2. The active metamaterial array of claim 1,
wherein the conductivity is greater than a predetermined reference level, the plurality of metamaterial structures is controlled as a single metamaterial molecular structure.

3. The active metamaterial array of claim 2,
wherein in the metamaterial molecular structure, the plurality of metamaterial structures is arranged horizontally, vertically, or in a matrix form and connected to each other.

4. The active metamaterial array of claim 1,
wherein the electrolyte material layer contains an electrolyte liquid, gel, or a solidified electrolyte.

5. The active metamaterial array of claim 1,
wherein the gate electrode is formed as multiple units, and the gate electrodes are formed on one end and the other end, respectively, of the substrate, and
different voltages are applied to the respective gate electrodes.

6. The active metamaterial array of claim 5,
wherein the electrolyte material layer includes multiple first electrolyte material layers and second electrolyte material layers,
the gate electrodes include a first gate electrode and the second gate electrode disposed on one end and the other end, respectively, of the substrate, and
the first electrolyte material layers are connected to the first gate electrode and the second electrolyte material layers are connected to the second gate electrode.

7. The active metamaterial array of claim 6,
wherein the first and second electrolyte material layers are formed into multiple of user defined shapes and arranged alternately.

8. The active metamaterial array of claim 1,
wherein the conductivity variable material layer is formed on or under the metamaterial structures to selectively connect the metamaterial structures.

9. The active metamaterial array of claim 1,
Wherein the metamaterial structure is configured as any shape showing the resonance property for the input wave, particularly including a rectangular intermediate portion and both end portions formed on both sides of the intermediate portion, and
the intermediate portion has a greater horizontal length than the both end portions and a smaller vertical length than the both end portions.

10. The active metamaterial array of claim 1,
wherein the conductivity variable material layer has a sufficient length to connect the plurality of metamaterial structures and is formed as multiple layers in one direction, and the multiple conductivity variable material layers are spaced apart from each other.

11. The active metamaterial array of claim 1,
wherein the electrolyte material layer is formed as one layer corresponding in size to all of the metamaterial structures or formed as multiple layers corresponding in length to each column or each row of the metamaterial structures arranged in a matrix form.

12. A method for manufacturing an active metamaterial array, comprising:

forming a plurality of metamaterial structures on a substrate to be spaced apart from each other;

forming a semiconductor or a conductivity variable material layer between each of the plurality of metamaterial structures so as to selectively connect the metamaterial structures;

forming an electrolyte material layer on the metamaterial structures and the conductivity variable material layer; and forming a gate electrode to be disposed at one end of the substrate so as to be in contact with one region of the electrolyte material layer, wherein when an external voltage is applied to the gate electrode, the gate electrode changes the conductivity of the conductivity variable material layer by controlling the migration of ions contained in the electrolyte material layer, wherein as the conductivity of the conductivity variable material layer is changed, all of the plurality of metamaterial structures are connected or disconnected, and, thus, a resonant frequency and a phase are changed.

* * * * *